US011081429B2

(12) United States Patent
Chien et al.

(10) Patent No.: US 11,081,429 B2
(45) Date of Patent: Aug. 3, 2021

(54) FINGER PAD LEADFRAME

(71) Applicant: Texas Instruments Incorporated, Dallas, TX (US)

(72) Inventors: Jason Chien, New Taipei (TW); J K Ho, New Taipei (TW); Yuh-Harng Chien, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/600,615

(22) Filed: Oct. 14, 2019

(65) Prior Publication Data

US 2021/0111103 A1    Apr. 15, 2021

(51) Int. Cl.
*H01L 23/495* (2006.01)
*H01L 21/00* (2006.01)
*H01L 23/48* (2006.01)
*H01L 23/498* (2006.01)
*H01L 23/00* (2006.01)

(52) U.S. Cl.
CPC ...... *H01L 23/4951* (2013.01); *H01L 23/4952* (2013.01); *H01L 23/49513* (2013.01); *H01L 23/49541* (2013.01); *H01L 23/49575* (2013.01); *H01L 23/49861* (2013.01); *H01L 24/85* (2013.01); *H01L 2224/04042* (2013.01); *H01L 2924/14* (2013.01)

(58) Field of Classification Search
CPC .......... H01L 23/4951; H01L 23/49513; H01L 23/49541; H01L 23/49575; H01L 23/4952; H01L 23/49861; H01L 24/85; H01L 2224/04042; H01L 2924/14
See application file for complete search history.

(56) References Cited

U.S. PATENT DOCUMENTS

| | | | |
|---|---|---|---|
| 4,937,656 A * | 6/1990 | Kohara | H01L 23/49541 257/676 |
| 6,437,447 B1 | 8/2002 | Huang et al. | |
| 7,511,364 B2 | 3/2009 | Corisis | |
| 2010/0038759 A1* | 2/2010 | Lam | H01L 23/49548 257/676 |
| 2011/0248392 A1* | 10/2011 | Javier | H01L 23/49548 257/676 |
| 2016/0284629 A1* | 9/2016 | Shea | H01L 23/49541 |

* cited by examiner

*Primary Examiner* — David C Spalla
(74) *Attorney, Agent, or Firm* — Ronald O. Neerings; Charles A. Brill; Frank D. Cimino

(57) ABSTRACT

A packaged semiconductor device includes a leadframe including a finger pad(s) that is integrated, and spans a finger pad area including a width narrower than its length. A first portion of the finger pad area provides a die support area. A second portion of the finger pad area provides a wire bond area including first and second wire bond pads on a first and second side of the die support area. One of the wire bond pads further includes a lead terminal integrally connected. The IC die has a top side with bond pads and a back side having a non-electrically conductive die attach material attached to the die support area. Bond wires extend from the bond pads to the first and second wire bond pads. A mold compound encapsulates the packaged semiconductor device leaving exposed at least the lead terminal on a bottom side of the packaged semiconductor device.

24 Claims, 8 Drawing Sheets

FINGER PAD LEADFRAME

FIELD

This Disclosure relates to leadframes for semiconductor packaged devices.

BACKGROUND

A variety of semiconductor chip packages are known that provide support for an integrated circuit (IC) die or other semiconductor die and associated bond wires, provide protection from the environment, and enable surface mounting of the die generally to and interconnection with a printed circuit board (PCB). One conventional package configuration includes a leadframe having a die pad and lead terminals.

Leadframe semiconductor packages are well known and widely used in the electronics industry to house, mount, and interconnect a variety of ICs. A conventional leadframe is typically die-stamped from a sheet of flat-stock metal referred to as a leadframe strip (or panel), and includes a plurality of metal leads or lead terminals temporarily held together in a planar arrangement about a central region during package manufacture by a rectangular frame comprising a plurality of expendable "dam-bars." A mounting pad for a semiconductor die is supported in the central region by "tie-bars" that attach to the frame. The leads extend from a first end integral with the frame to an opposite second end adjacent to, but spaced apart from, the die pad.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a problem for wire bonded packaged semiconductor devices is that the bond wire layout can be a challenge for the leadframe design and for mount and bond (MB) diagram generation which indicates the actual die and wire bond location, particularly as the number of bond pads on the IC die becomes relatively high. There can also be a significant risk of creating a bond wire short. Moreover, there may be too limited a space for placement of stitch bond wires.

Disclosed aspects solve the problem of an overly limited a space for stitch bond wire placement by providing a new leadframe design referred to herein as a "finger pad" design that replaces a conventional single piece and continuous die pad with at least one finger pad that is integrated having a finger pad area including a length in length direction and a width in width direction that is narrower as compared to length. The finger pad(s) include wire bond pads on both sides along the length of the finger pad. In the case of a plurality of finger pads, the plurality of finger pads are spaced apart from one another, which collectively circumscribe a finger pad area, where the finger pads are generally aligned parallel to one another. Disclosed finger pad designs due to being able to place bond wires on wire bond pads both sides of the finger pad(s) increase the usable lead tip area for wire bonding to connect to bond pads on the IC die as compared to conventional leadframes. The number of finger pads generally depends on how many bond wires need to be connected by the finger pad(s), so that in some arrangements there can be only a single finger pad, such as shown in FIG. 2B described below.

Disclosed aspects include a packaged semiconductor device including a disclosed leadframe including a finger pad(s) that is integrated, and spans a finger pad area including a width narrower than its length. A first portion of the finger pad area provides a die support area. A second portion of the finger pad area provides a wire bond area including first and second wire bond pads on a first and a second side of the die support area. One of the wire bond pads further includes a lead terminal that is integrally connected. The IC die has a top side with bond pads and a back side having a non-electrically conductive die attach material attached to the die support area. Bond wires extend from the bond pads to the first wire bond pad and to the second wire bond pad. A mold compound encapsulates the packaged semiconductor device leaving exposed at least the lead terminal on a bottom side of the packaged semiconductor device.

BRIEF DESCRIPTION OF THE DRAWINGS

Reference will now be made to the accompanying drawings, which are not necessarily drawn to scale, wherein.

DETAILED DESCRIPTION

Figure 1A:
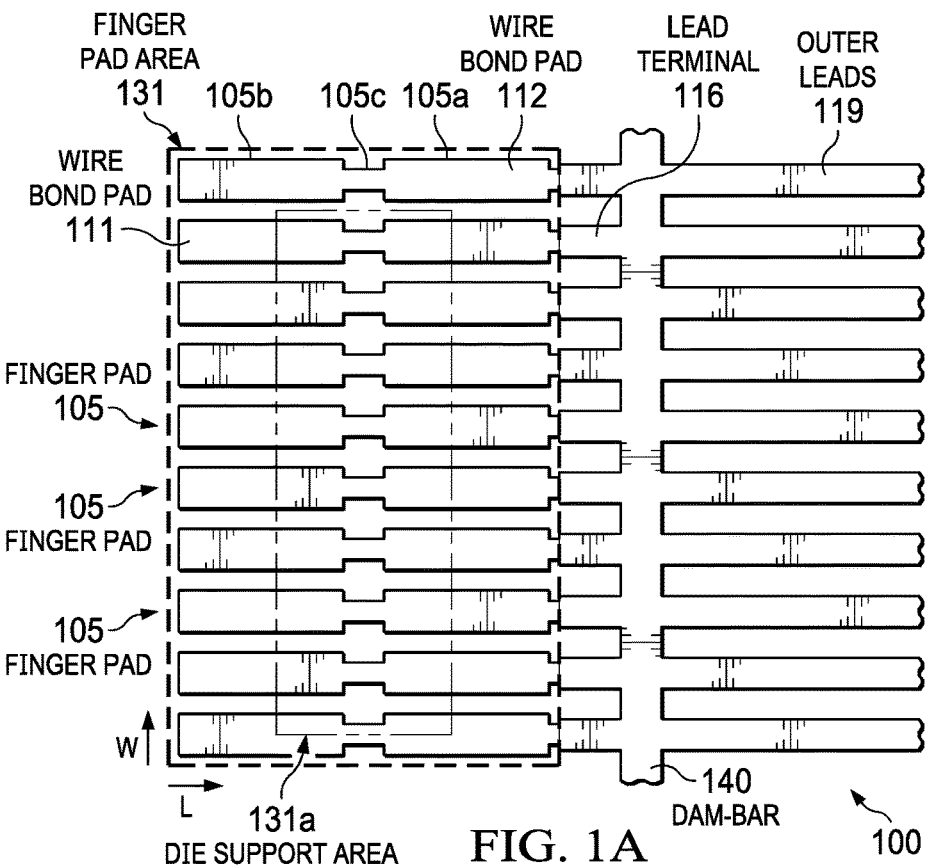
FIG. 1A is a depiction of an example leadframe for a leaded packaged device comprising a plurality of finger pads that are spaced apart from one another, that collectively circumscribe a finger pad area, where the finger pads are aligned parallel to one another each having a length in a length direction, and a width in a width direction that is narrower as compared to the length, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is a depiction of an example leadframe 100 for a leaded packaged device comprising a plurality of finger pads 105 that are spaced apart from one another, that collectively circumscribe a finger pad area 131, wherein the finger pads 105 are aligned parallel to one another each having a length in a length direction shown as L, and a width in a width direction shown as W that is narrower as compared to the length, according to an example aspect. The length of the finger pads 105 is generally at least five times a maximum width of the finger pads 105, such as at least 10 times longer than wide. Although shown as a single leadframe 100, as known in the art the leadframe 100 is generally joined with a plurality of other identical leadframes in a two-dimensional (2D) array known as a leadframe strip (or panel).

The finger pads 105 generally comprise a metal or a metal alloy material, such as copper or a copper alloy, that are each integrated. As used herein the term 'integrated' applied to disclosed finger pads 105 means only one piece, with no material junctions or bonding agents such as adhesives holding 2 or more pieces together. However, the finger pads 105 can optionally be metal plated.

A first portion of the finger pad area 131 provides a die support area 131a for supporting an IC die that has a top side with circuitry and bond pads connected to nodes in the circuitry. A second portion of the finger pad area provides a wire bond area that includes first wire bond pads 111 and second wire bond pads 112 on a first and second side of the die support area 131a respectively, for positioning bond wires between the bond pads and the first and the second wire bond pads 111, 112. One of the first and the second wire bond pads 111, 112 further comprise integrally connected lead terminals 116 that are integrally connected to outer leads 119. A dam-bar 140 has a length oriented in the width direction including for physically connecting to the lead terminals 116 adapted for maintaining alignment of the finger pads 105.

The finger pads 105 are shown including an optional comparatively narrow inner finger portions 105c shown around the center of the length of the finger pads 105, with wider finger portions 105a and 105b on respective sides of the inner finger portions 105c. The width of the inner finger portions 105c is generally at least 10% narrower as compared to the relatively wider finger portions 105a and 105b. The extent of the narrowing of the inner finger portions 105c generally depends on the leadframe manufacturing capability. The function of the inner finger portion 105c being narrower is to function as a mold lock since the finger pad concept may have a relatively long length finger pad portions inside of the package, which may increase the delamination risk during trim-form (TF) processing. A narrower inner finger portion 105c near the center of the finger pads 105 creates more corners and is thus helpful to fix the finger pads when encountering external stress. It can be seen that there is no tie bar structure for the leadframe 100.

A maximum of the width of the finger pads 105 along the length direction is generally between 0.4 mm and 0.6 mm, and when the finger pads comprise a plurality of finger pads a minimum spacing between adjacent finger pads 105 is generally between 0.2 mm and 0.3 mm. The minimum width of the finger pad 105 is generally determined by leadframe manufacturing capability. The minimum width of a finger pad for a 10-mil thick leadframe may be about 0.22 mm. The width of inner finger portion 105c of the finger pad 105 can be designed based on a wire bond layout requirement. In the case of a leadframe for a leaded package, however, the lead terminal 116 should generally have the same width as the outer lead 119 in order to perform the trim-form (TF) process. The width of the outer leads 119 will generally be determined by the package outline. As known in the art a TF process is used to remove packages from the leadframe strip to provide individual packaged ICs. Both etched and stamped leadframes generally need to have the same width for the lead terminal 116 and the outer leads 119.

Figure 1B:
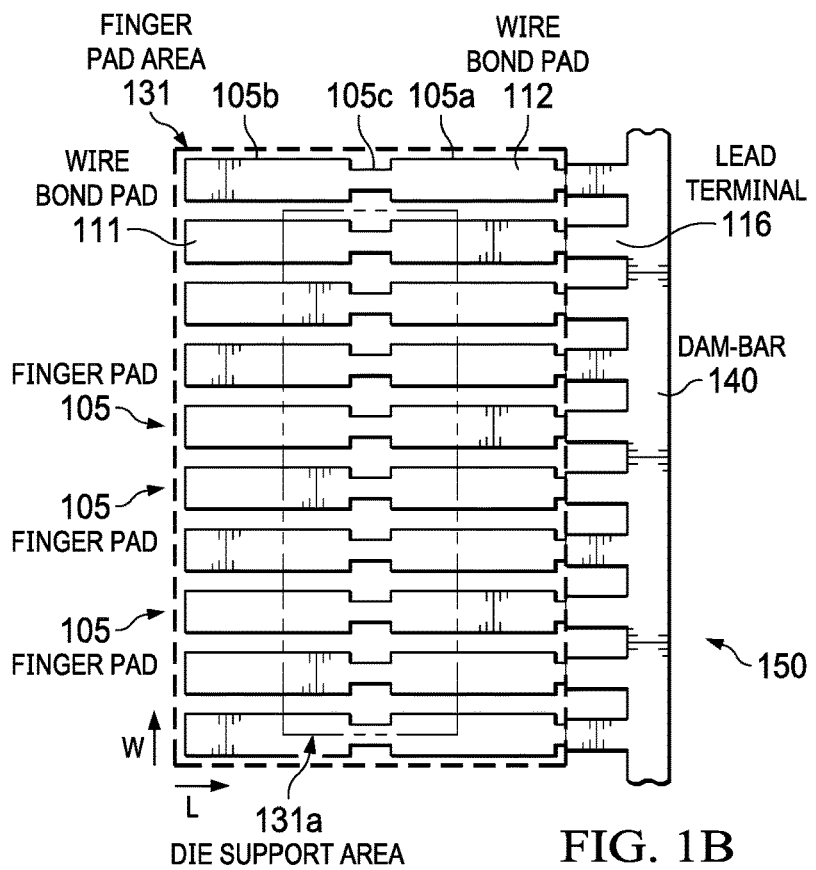
FIG. 1B is a depiction of an example leadframe for a leadless packaged device comprising plurality of finger pads that are spaced apart from one another, that collectively circumscribe a finger pad area, where the finger pads are aligned parallel to one another each having a length in a length direction, and a width in a width direction that is narrower as compared to the length, according to an example aspect.

Disclosed aspects also apply to leadless packages, such as to quad flat no lead (QFN) packages. FIG. 1B is a depiction of an example leadframe 150 for a leadless packaged device comprising a plurality of finger pads 105 that are spaced apart from one another, which collectively circumscribe a finger pad area 131, wherein the finger pads 105 are aligned parallel to one another each having a length in a length direction again shown as L, and a width in a width direction again shown as W that is narrower as compared to the length, according to an example aspect. For leadframe 150 being a leadless package, there are no outer leads 119, and at least a back side of the lead terminals 116 will be exposed from the mold compound to enable making electrical connection to the IC in the finished packaged device.

Figure 2A:
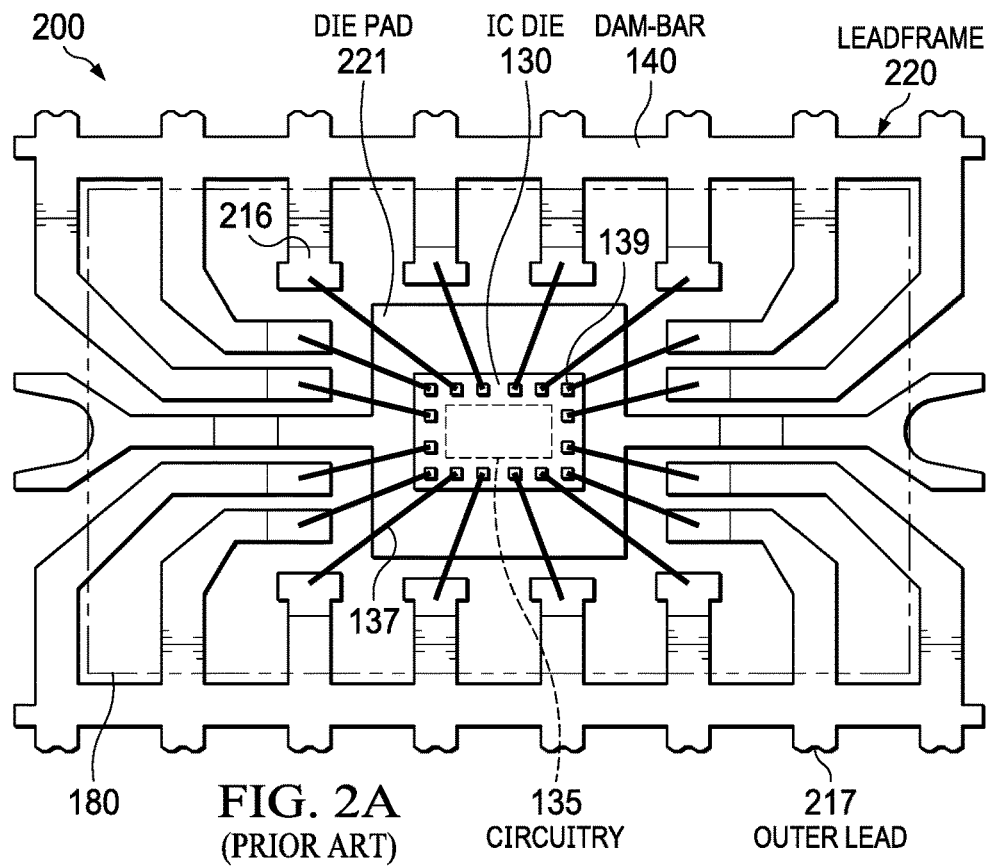
FIG. 2A is depiction of a conventional wire bonded leaded single die package having a leadframe with a die pad that has an IC die that is attached back side down onto the die pad.

FIG. 2A is depiction of a conventional wire bonded leaded single die package 200 having a leadframe 220 with a die pad 221 that has an IC die 130 including circuitry 135 coupled to bond pads 139, where the IC die 130 is attached to the die pad 221. There are bond wires 137 between the bond pads 136 and the wire bond pads 216 of the leadframe 220. The wire bond pads 216 are connected to outer leads 217 which extend outside a molded package body that generally comprises an epoxy material shown as 180. The dam-bar is shown as 140. As known in the art, after mounting IC die 130, wire bonding and then molding a leadframe strip including a plurality of leadframes, the respective packaged devices are then singulated from the leadframe strip to form a plurality of finished packaged devices.

The circuitry 135 as known in the art generally comprises circuit elements (including transistors, and generally diodes, resistors, capacitors, etc.) that may be formed in an epitaxial layer on a bulk substrate material such as silicon, or in the bulk substrate material itself, where the circuitry is configured together for generally realizing at least one circuit function. Example circuit functions include analog (e.g., amplifier or power converter), radio frequency (RF), digital, or non-volatile memory functions.

Figure 2B:
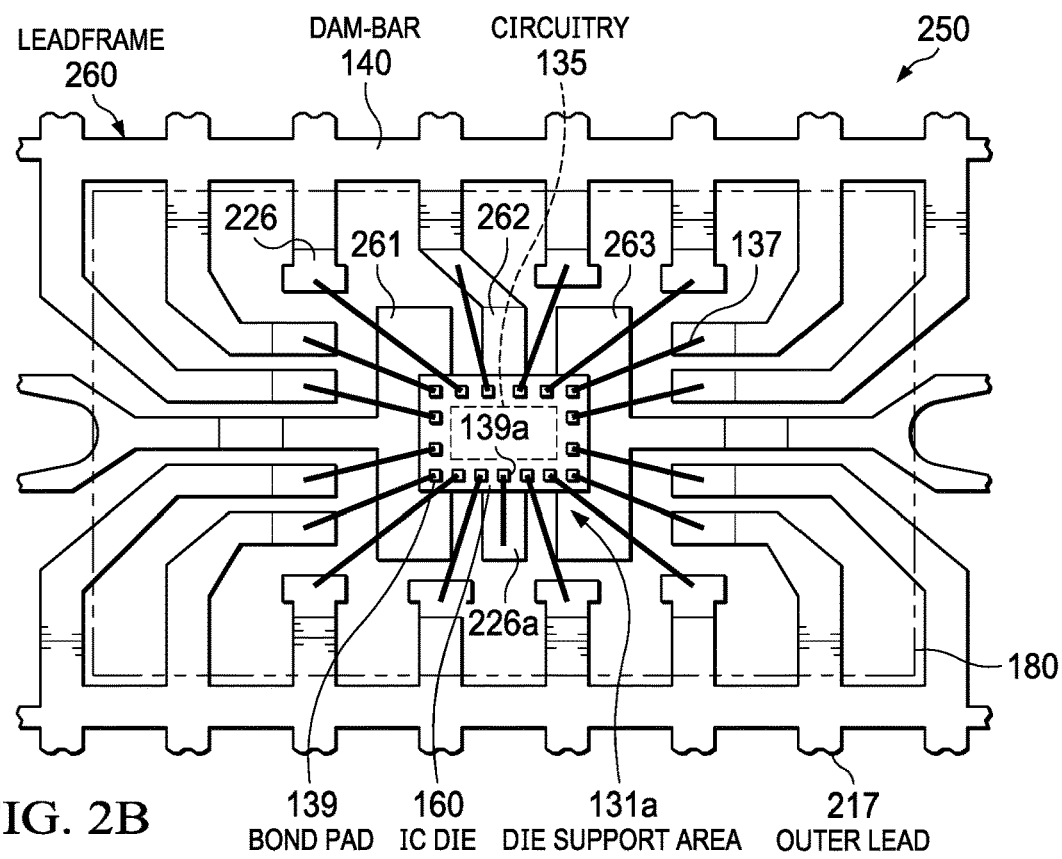
FIG. 2B is depiction of an example wire bonded leaded single die package having a leadframe with a disclosed finger pad design that has an IC die which is attached to a die support area including a single finger pad, according to an example aspect. The IC die shown in FIG. 2B can be seen to include the same circuitry but with one additional bond pad on the bottom row of bond pads as compared to the IC die shown in FIG. 2A, where the extra bond pad is bonded to a wire bond pad of the finger pad.

FIG. 2B is depiction of an example wire bonded leaded single die package 250 having a leadframe 260 with a disclosed finger pad design shown including a single finger pad 262, according to an example aspect. Metal features 261 and 263 of the leadframe 260 are on respective sides of the finger pad 262 are not utilized as finger pads since they do not provide any electrical connection to bonding wires. Metal features 261 and 263 instead function as a die pad portion, where metal features 261 and 263 are connected to a leadframe strip during assembly by a tie bar. The IC die now shown as 160 having circuitry 135 is attached to a die support area 131a of the finger pads 262 that corresponds to an area of the IC die 160. The finger pad 262 as with all disclosed finger pads is integral and includes wire bond pads shown as wire bond pad 226a that is integrally connected to an outer lead 217, thus providing the same outer lead configuration as the outer lead configuration shown in FIG. 2A. Conventional wire bond pads are shown as 226.

The IC die 160 shown in FIG. 2B can be seen to include one more bond pad as compared to the IC die 130 shown in FIG. 1A, where the extra bond pad shown as 139a for simplicity as a single bond that is on the bottom row of bond pads that is shown wire bonded to a wire bond pad of the finger pad 262. Although shown in FIG. 2B having only a single IC die, disclosed aspects apply to not only single IC die packages, but also multiple IC die packages that replace at least one of the die pads with a disclosed finger pad design. It may be possible for multiple die pad packages that conventionally have two more die pads to each be replaced by disclosed finger pads as long as there is enough clearance for the finger pads to extend to the opposite side of the package utilized by disclosed packages.

The finger pads for the leadframe 260 which although shown as only finger pad 262 as noted above can comprise a plurality of finger pads, which replaces the entire die pad 221 of the leadframe 220 shown in FIG. 2A by providing a die support area 131a and wire bond pads. As described below, between the IC die 160 and the finger pads in the die support area 131a is a non-electrically conductive die attach material, that can comprise a DAF, or an epoxy-based die attach material may also be dispensed. Leadframe 260 provides a larger space inside the package available due to the presence of wire bond pads located on at least one end of the finger pads to bond to for stitch bond pad placement between bond pads on the IC die 160 and the wire bond pad(s) shown in FIGS. 1A and 1B as 111 and 112, and as shown in FIG. 2B as 226a. Thus, as evidenced in FIG. 2B, the finger pad 262 also increases the circuit design flexibility to enable the IC die 160 to have an increased number of bond pads (as noted above shown for simplicity as a single extra bond pad 139a) under the same pin count without any additional assembly cost.

Figure 3A:
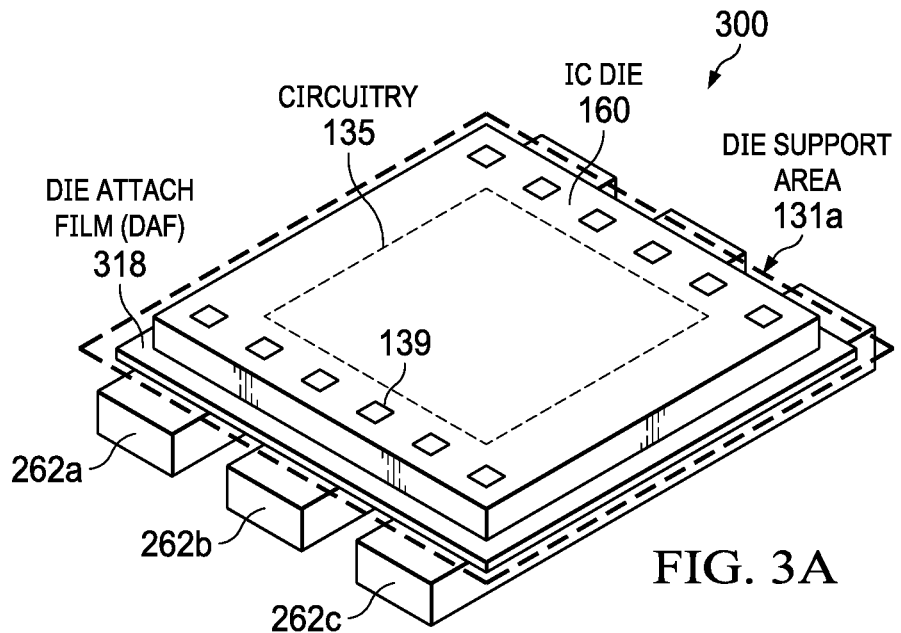
FIG. 3A is a depiction of a portion of a packaged device excluding the bond wires and the mold compound to reveal features, including at least one IC die shown attached by a continuous die attach film (DAF) over the finger pads in the die support area of a disclosed leadframe including, according to an example aspect.

FIG. 3A is a depiction of a portion of a packaged device 300 excluding the bond wires and the mold compound to reveal features, including at least one IC die 160 having circuitry 135 coupled to bond pads 139 shown attached by a DAF 318 that is formed as a continuous sheet generally while the ICs are in wafer form, to finger pads in a die support area 131a of a disclosed leadframe, according to an example aspect. A DAF 318 is generally used as opposed to an epoxy material when the minimum width of the finger pads is less than or equal to about 0.20 mm to 0.22 mm due to width limitations obtainable for an epoxy dispense process. As long as there is at least one finger pad that is too narrow for dispensing, a DAF is generally used as the die attach material.

Figure 3B:
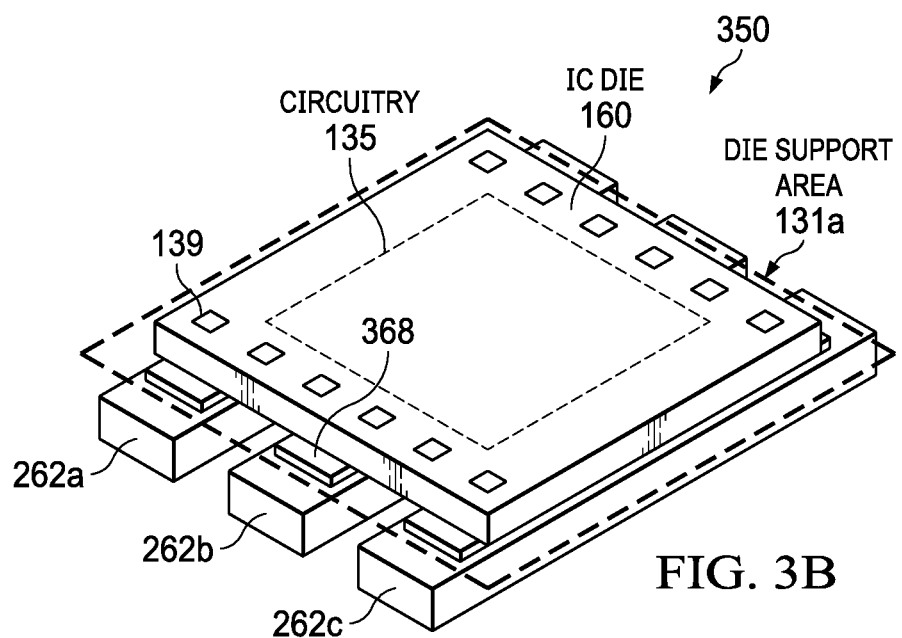
FIG. 3B is a depiction of a portion of a packaged device excluding the bond wires and the mold compound to reveal features, including at least one IC die shown attached by a separate epoxy die attach layer portion on each of the finger pads of a disclosed leadframe, according to an example aspect.

The IC die 160 is shown transparent in FIG. 3A to enable seeing through to the DAF 318 that is on the finger pads which are now shown as 262a, 262b and 262c in the die support area 131a. FIG. 3B is a depiction of a portion of a packaged device 350 excluding the bond wires and the mold compound to reveal features with the IC die 160 again shown being transparent, according to an example aspect. The packaged device 350 includes at least one IC die 160 shown attached by an epoxy die attach layer 368 that is separately dispensed within each of the finger pads in a die support area 131a of a disclosed leadframe.

Figure 4A:
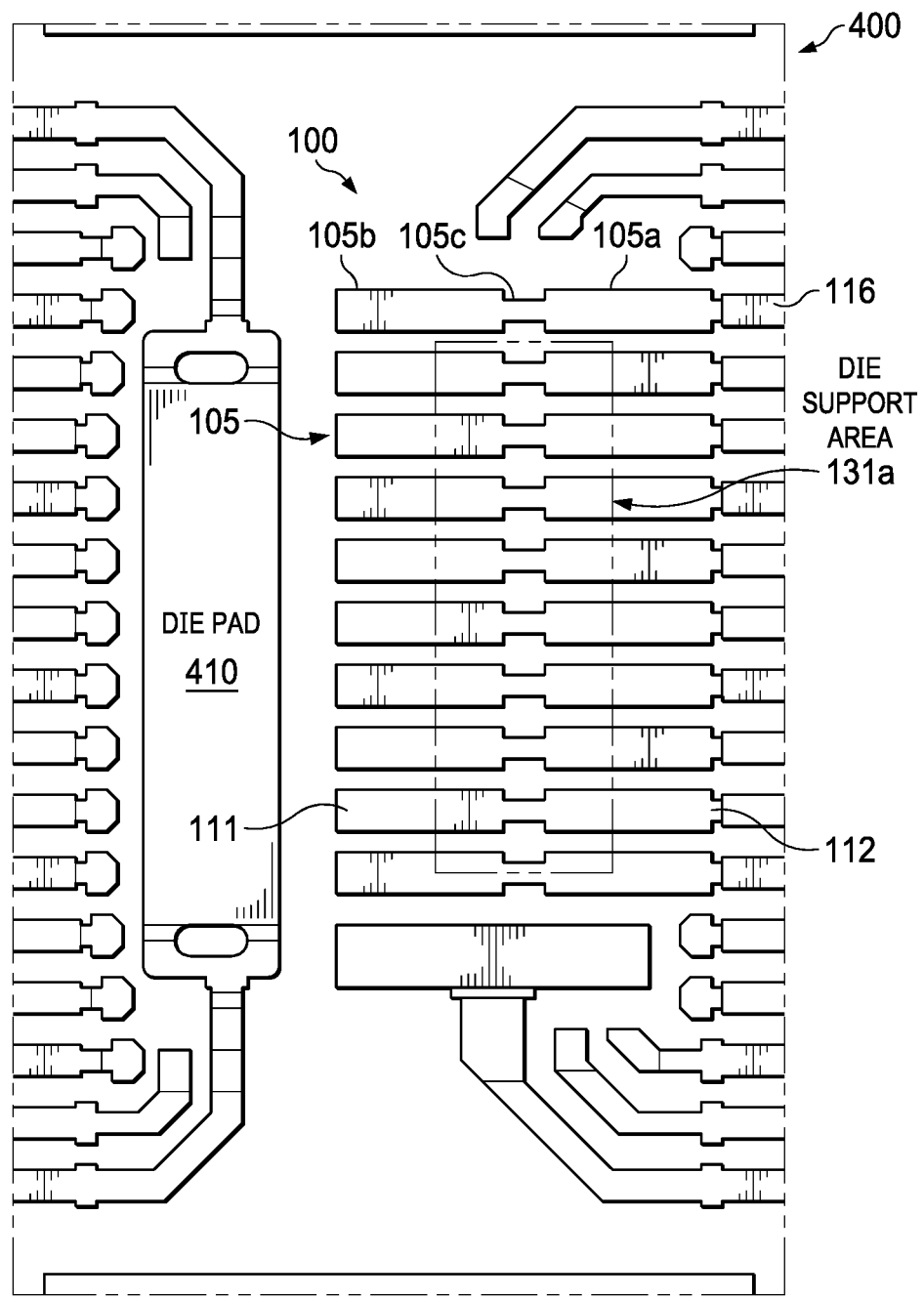
FIG. 4A shows an example multichip (MCM) module that excludes the bond wires and the mold compound to reveal features, that can comprise a digital isolator that includes one of its IC die assembled on a disclosed leadframe comprising finger pads that is analogous to the leadframe shown in FIG. 1A having finger pads.
Figure 4B:
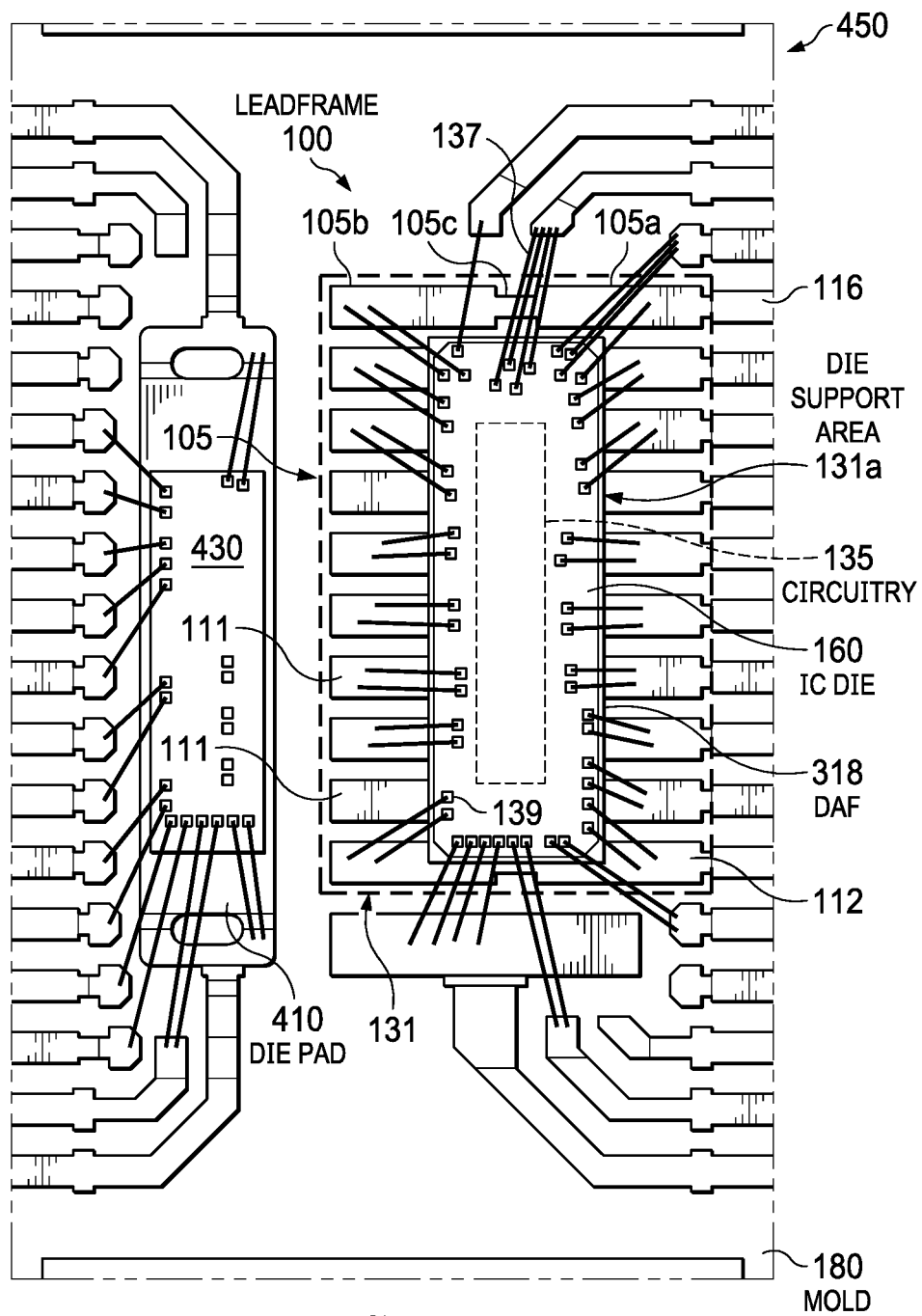
FIG. 4B shows the MCM module in FIG. 4A now with bond wires between bond pads of the IC die and the lead terminals of the finger pads.

FIG. 4A shows an example MCM module 400 that excludes the bond wires and the mold compound to reveal features, that can comprise a digital isolator which includes one of its IC die assembled on a disclosed leadframe that is analogous to the leadframe 100 shown in FIG. 1A having finger pads 105. The other die in the MCM 400 module is shown as 430 that generally has its own conventional die pad shown at 410. As noted above the MCM module 400 can in one arrangement comprise a digital isolator. FIG. 4B shows the MCM module in FIG. 4A shown as 450 now with bond wires 137 between the bond pads 139 on the IC die 160 and the wire bond pads 111, 112 of the finger pads 105. Mold compound is again shown as 180.

Figure 5A:
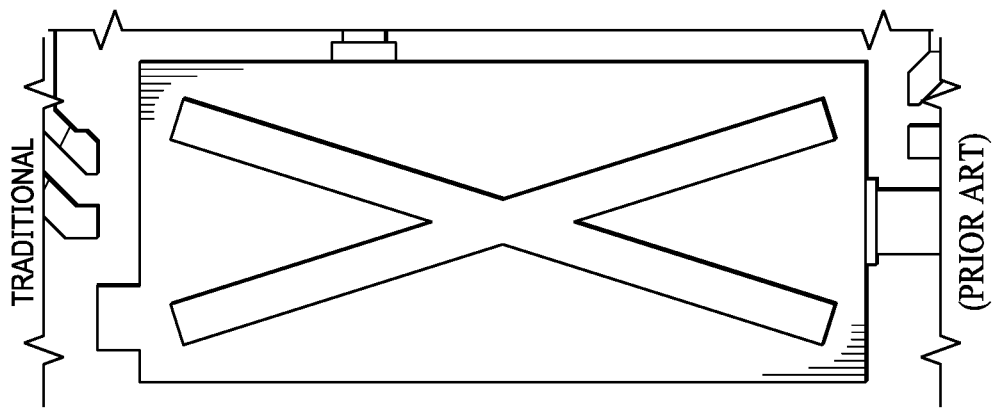
FIG. 5A depicts the results from the dispensing of an epoxy die attach onto each of finger pads of a disclosed leadframe alongside a single "X"-shaped epoxy die attach pattern that is generally used on a conventional die pad.
Figure 5A:
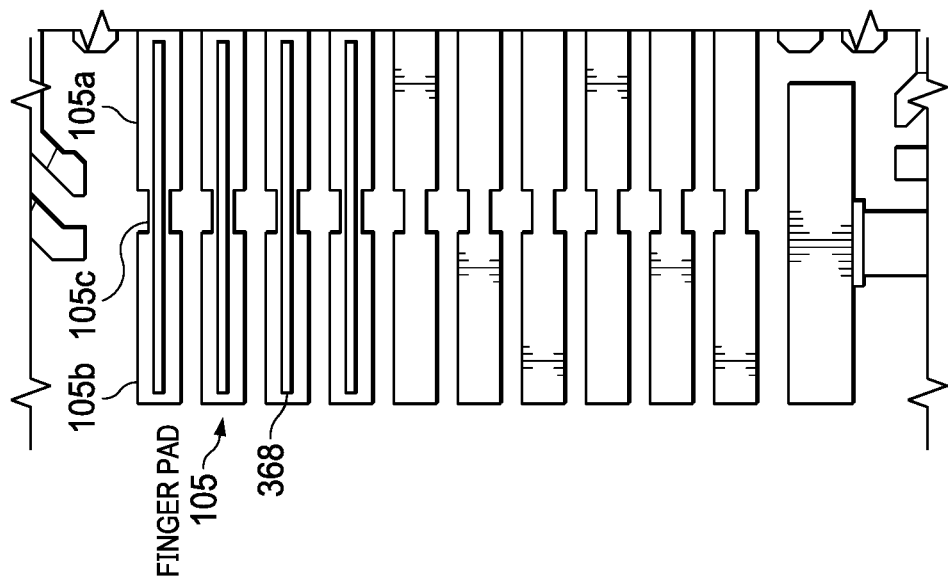

FIG. 5A depicts on the left side the results during die attach material processing (shown only partially completed) from dispensing of an epoxy die attach layer 368 onto each of finger pads 105 of a disclosed leadframe alongside on the right side showing an "X"-shaped epoxy die attach pattern that is generally used on a conventional die pad. The epoxy die attach layer 368 is seen on the left side to be completely within the area of the respective finger pads 105.

Figure 5B:
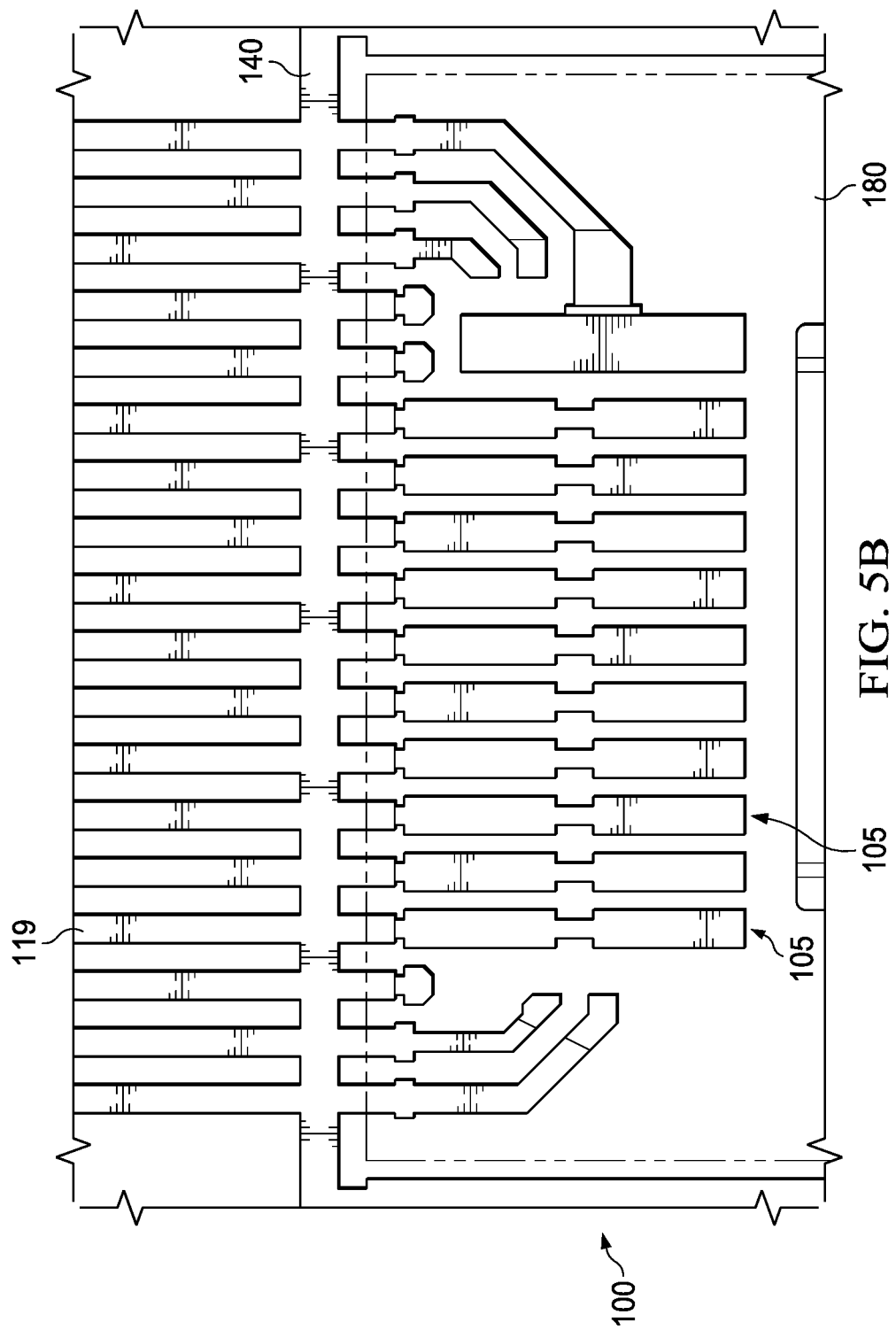
FIG. 5B shows a portion of an example packaged device before cutting of the dam-bar and the leads showing the mold compound and a disclosed leadframe, but excludes an IC die on the die support area and the bond wires to reveal features.
Figure 5C:
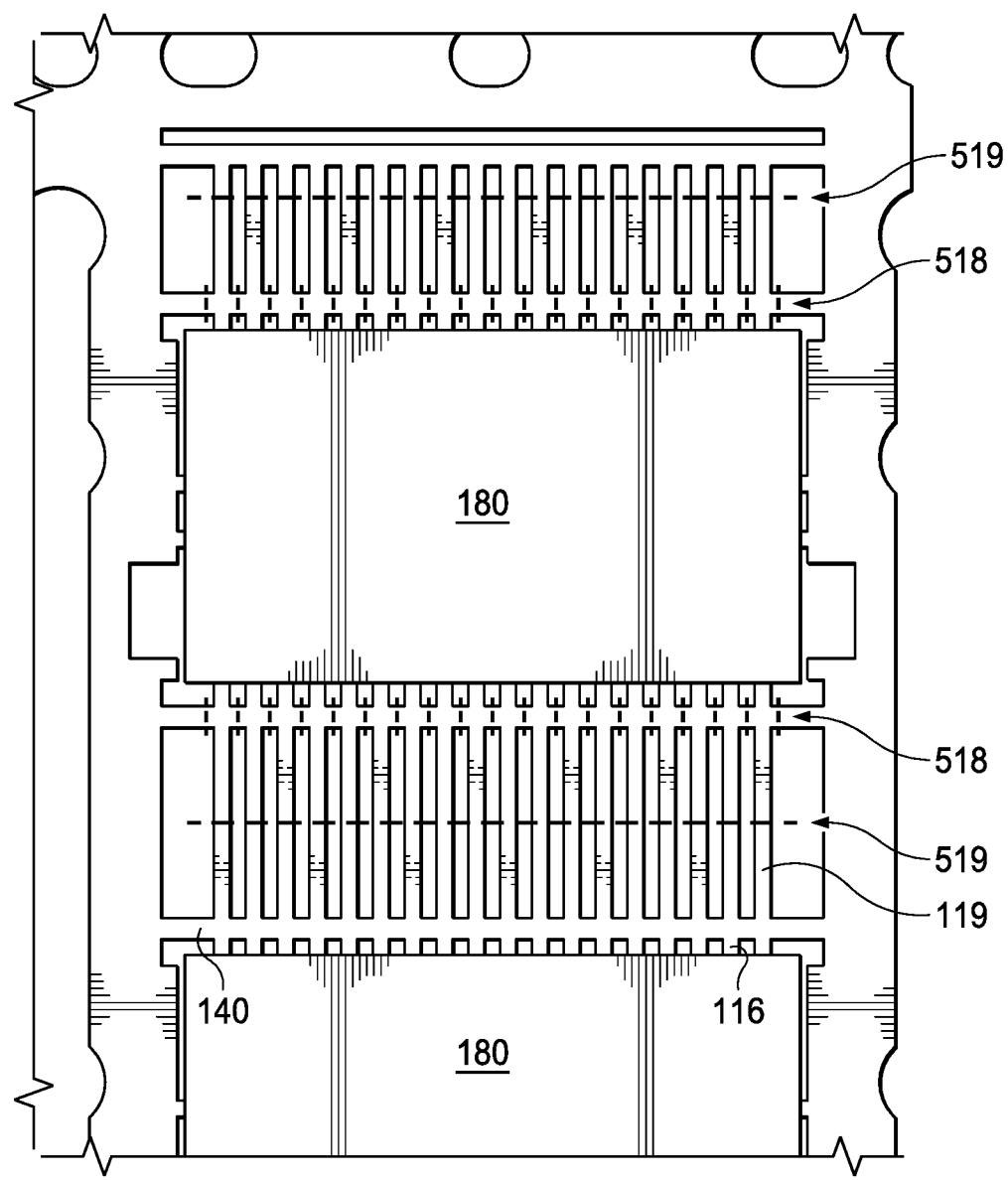
FIG. 5C shows a portion of a leadframe strip showing positions of the cutting locations for removing the dam-bar and for cutting for isolating the outer leads.

FIG. 5B shows a portion of an example packaged device before cutting the cutting of the dam-bar 140 and to electrically isolate the finger pads 105 showing the mold compound 180 and a disclosed leadframe 100, but excludes an IC die on the die support area and the bond wires to reveal features. FIG. 5C shows a portion of a lead frame strip showing positions of the cutting locations shown as 518 for removing the dam-bar 140 that generally comprises a TF process and cutting locations 519 for cutting to electrically isolate the outer leads 119 and thus the finger pads 105 from one another. The TF punch electrically isolates the finger pads 105 by removing the dam-bar 140 area. Each of the finger pads 105 including optional outer leads 119 will be electrically isolated once the dam-bar 140 is cut-off by this TF punch process.

Disclosed finger pad leadframes can be integrated into a variety of assembly flows to form a variety of different packaged semiconductor devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A leadframe, comprising:
at least one finger pad that is integrated having a finger pad area including a length in a length direction, and a width in a width direction that is narrower as compared to the length;
a first portion of the finger pad area providing a die support area adapted for supporting an integrated circuit (IC) die that has a top side with circuitry and bond pads connected to nodes in the circuitry;
a second portion of the finger pad area providing a wire bond area including first wire bond pads and second wire bond pads on a first and second side of the die support area, respectively, for positioning bond wires between the bond pads and the wire bond pads on both of the sides;
one of the first and second wire bond pads further comprising a lead terminal that is integrally connected, and
a dam-bar having a length oriented in the width direction including for connecting to the lead terminal for maintaining alignment of the at least one finger pad.

2. The leadframe of claim 1, wherein the at least one finger pad comprises a plurality of the finger pads that are spaced apart from one another which collectively circumscribe the finger pad area, and wherein the plurality of finger pads are aligned parallel to one another.

3. The leadframe of claim 1, further comprising an outer leadframe configuration including outer leads integrally connected to the dam-bar positioned opposite to the lead terminals.

4. The leadframe of claim 1, wherein the lead terminals are adapted for being exposed at least on a bottom side of a packaged semiconductor device after a molding step.

5. The leadframe of claim 1, wherein the at least one finger pad in the die support area have a relatively narrow inner portion that is at least 10% narrower as compared to the width of the at least one finger pad on respective sides of the inner portion.

6. The leadframe of claim 1, wherein the length of the at least one finger pads is at least 5 times a maximum of the width of the at least one finger pad.

7. The leadframe of claim 2, wherein a maximum of the width of the plurality of finger pads along the length is between 0.4 mm and 0.6 mm, and wherein a minimum spacing between adjacent ones of the plurality of finger pads is between 0.2 mm and 0.3 mm.

8. The leadframe of claim 1, wherein the leadframe further comprises a die pad spaced apart from the finger pad area.

9. A packaged semiconductor device, comprising:
at least one finger pad having a finger pad area including a length in a length direction, and a width in a width direction that is narrower as compared to the length;
a first portion of the finger pad area providing a die support area for supporting an integrated circuit (IC) die;
a second portion of the finger pad area providing a wire bond area including first wire bond pads and second wire band pads on a first side and a second side of the die support area, respectively, bond wires coupling the bond pads to selected ones of the first and the second wire bond pads;
one of the first and second wire bond pads further comprising a lead terminal, the other of the first and second wire bond pads not comprising a lead terminal,
the IC die having a top side with circuitry and bond pads connected to nodes in the circuitry and a back side having a non-electrically conductive die attach material attaching the back side to the die support area; and
a mold compound for encapsulating the packaged semiconductor device leaving exposed at least the lead terminal on a side of the packaged semiconductor device.

10. The packaged semiconductor device of claim 9, wherein the die attach material comprises a film.

11. The packaged semiconductor device of claim 9, wherein the length of the at least one finger pad is at least 5 times a maximum of the width of the at least one finger pad.

12. The packaged semiconductor device of claim 9, wherein the leadframe further comprises a die pad spaced apart from the finger pad area.

13. A packaged semiconductor device, comprising:
at least one finger pad that is integrated having a finger pad area including a length in a length direction, and a width in a width direction that is narrower as compared to the length;
a first portion of the finger pad area providing a die support area for supporting an integrated circuit (IC) die;
a second portion of the finger pad area providing a wire bond area including first wire bond pads and second wire band pads on a first side and a second side of the die support area, respectively, for positioning bond wires between the bond pads and the first and the second wire bond pads;
one of the first and second wire bond pads further comprising a lead terminal that is integrally connected,
the IC die having a top side with circuitry and bond pads connected to nodes in the circuitry and a back side having a non-electrically conductive die attach material attaching the back side to the die support area;
bond wires extending from the bond pads to the first wire bond pads and to second wire bond pads, and
a mold compound for encapsulating the packaged semiconductor device leaving exposed at least the lead terminal on a bottom side of the packaged semiconductor device, wherein the at least one finger pad comprises a plurality of the finger pads that are spaced apart from one another which collectively circumscribe the finger pad area, and wherein the plurality of finger pads are aligned parallel to one another.

14. The package semiconductor device of claim 13, wherein the die attach material comprises an epoxy material including separate layers on each of the plurality of finger pads.

15. The packaged semiconductor device of claim 13, wherein a maximum of the width of the plurality of finger pads along the length is between 0.4 mm and 0.6 mm, and wherein a minimum spacing between adjacent ones of the plurality of finger pads is between 0.2 mm and 0.3 mm.

16. A packaged semiconductor device, comprising:
at least one finger pad that is integrated having a finger pad area including a length in a length direction, and a width in a width direction that is narrower as compared to the length;
a first portion of the finger pad area providing a die support area having a relatively narrow inner portion that is at least 10% narrower as compared to the width of the at least one finger pad on respective sides of the inner portion for supporting an integrated circuit (IC) die;
a second portion of the finger pad area providing a wire bond area including first wire bond pads and second wire band pads on a first side and a second side of the die support area, respectively, for positioning bond wires between the bond pads and the first and the second wire bond pads;
one of the first and second wire bond pads further comprising a lead terminal that is integrally connected,
the IC die having a top side with circuitry and bond pads connected to nodes in the circuitry and a back side having a non-electrically conductive die attach material attaching the back side to the die support area;
bond wires extending from the bond pads to the first wire bond pads and to second wire bond pads, and
a mold compound for encapsulating the packaged semiconductor device leaving exposed at least the lead terminal on a bottom side of the packaged semiconductor device.

17. A method of forming a packaged semiconductor device, comprising:
providing a leadframe strip comprising a plurality of leadframes, the leadframes each including:
at least one finger pad that is integrated having a finger pad area including a length in a length direction, and a width in a width direction that is narrower as compared to the length;
a first portion of the finger pad area providing a die support area for supporting an integrated circuit (IC) die;
a second portion of the finger pad area providing a wire bond area including first wire bond pads and second wire bond pads on a first side and on a second side of the die support area, respectively,
one of the first and second wire bond pads further comprising a lead terminal that is integrally connected, and
a dam-bar having a length oriented in the width direction including for connecting to the lead terminal for maintaining alignment of the at least one finger pad;
positioning the IC die having a top side with circuitry and bond pads connected to nodes in the circuitry and a back side, with the back side down onto the die support area,
positioning bond wires between the bond pads and the first wire by pad and the second wire bond pad;
molding to form a mold compound for encapsulation, and
singulation comprising cutting the dam-bar and cutting to electrically isolate the lead terminal.

18. The method of claim 17, wherein the at least one finger pad comprises a plurality of the finger pads that are spaced apart from one another which collectively circumscribe the finger pad area, and wherein the plurality of finger pads are aligned parallel to one another.

19. The method of claim 17, wherein the IC die includes a die attach film (DAF) on its back side, and wherein the method further comprises forming the DAF on a back side of a wafer comprising a semiconductor substrate including a plurality of the IC die.

20. The method of claim 18, wherein the method further includes separately dispensing an adhesive within an area of each of the plurality of finger pads within the die support area.

21. The method of claim 17, wherein the leadframe further comprises an outer leadframe configuration including outer leads integrally connected to the dam-bar positioned opposite to the lead terminal.

22. The method of claim 17, wherein the at least one finger pad in the die support area has a relatively narrow inner portion that is at least 10% narrower as compared to the width of the at least one finger pad on respective sides of the inner portion.

23. The method of claim 17, wherein the length of the at least one finger pad is at least 5 times a maximum of the width of the at least one finger pad.

24. The method of claim 18, wherein a maximum of the width of the plurality of finger pads along the length is between 0.4 mm and 0.6 mm, and wherein a minimum spacing between adjacent ones of the plurality of finger pads is between 0.2 mm and 0.3 mm.

* * * * *